US 6,654,052 B1

(12) United States Patent
Kitagawa et al.

(10) Patent No.: US 6,654,052 B1
(45) Date of Patent: Nov. 25, 2003

(54) CARD TYPE SEMICONDUCTOR MEMORY DEVICE

(75) Inventors: Shuji Kitagawa, Ibaraki (JP); Fumitaka Okamoto, Ibaraki (JP)

(73) Assignee: NuCore Technology Inc., Santa Clara, CA (US)

( * ) Notice: Subject to any disclaimer, the term of this patent is extended or adjusted under 35 U.S.C. 154(b) by 0 days.

(21) Appl. No.: 09/399,973

(22) Filed: Sep. 21, 1999

(30) Foreign Application Priority Data

Sep. 22, 1998 (JP) .......................................... 10-267606

(51) Int. Cl.$^7$ ............................ H04N 5/76; G11C 27/00
(52) U.S. Cl. ............................. 348/231.99; 348/231.7; 365/45
(58) Field of Search ........................ 348/231.99, 231.7, 348/231.1, 280; 365/45, 48

(56) References Cited

U.S. PATENT DOCUMENTS

| 5,329,484 A | 7/1994 | Tsuiki |
| 5,764,560 A | 6/1998 | Lee et al. |
| 6,147,630 A | * 11/2000 | Sasai et al. ................. 341/110 |
| 6,151,235 A | * 11/2000 | Kitagawa et al. ............. 365/45 |
| 6,559,895 B1 | * 5/2003 | Dosho ........................ 348/665 |

* cited by examiner

Primary Examiner—Wendy R. Garber
Assistant Examiner—Catherine J. Toppin
(74) Attorney, Agent, or Firm—Townsend and Townsend and Crew LLP; Kenneth R. Allen

(57) ABSTRACT

In a card type semiconductor memory device, at least one memory chip for storing a still image and a connector having a number of signal lines for transferring various signals between the memory chip and a host device are mounted on a card-like substrate. The memory chip includes a memory section and a signal processing section. The memory section includes analog nonvolatile semiconductor memories for sequentially storing, as analog values, color interleaved analog image signals having analog luminance information of predetermined colors in units of pixels in synchronism with a predetermined clock signal. The signal processing section calculates, as analog values, the luminance information at a plurality of pixel positions, which are read out from the memory section, to convert the luminance information into color image data having analog luminance information of the respective colors in units of pixels and outputs the color image data.

8 Claims, 4 Drawing Sheets

$C_{22} = (P_{11} + P_{13} + P_{31} + P_{33})/4 \cdots (1)$
$A_{22} = (P_{12} + P_{21} + P_{23} + P_{32})/4 \cdots (2)$
$B_{23} = (P_{22} + P_{24})/2 \qquad \cdots (3)$

CARD TYPE SEMICONDUCTOR MEMORY DEVICE

BACKGROUND OF THE INVENTION

The present invention relates to a card type semiconductor memory device and, more particularly, to a card type semiconductor memory device for storing a color interleaved analog image signal obtained using an image sensing element.

Generally, in an image sensing element for photographing a color still image, color filters of different colors (e.g., RGB: red, green, and blue) are arrayed in a Bayer matrix (substantially checkerboard pattern repeating array) in units of pixels, and an object luminance of a predetermined color is detected at each pixel position.

A still image formed from the luminance values of the pixels is output as a color interleaved analog image signal, i.e., a color interleaved analog image signal made of analog signals which have amplitudes representing the respective luminance values and are discrete on the time axis.

Conventionally, in, e.g., a digital still camera apparatus, a digital memory is used as a storage medium for storing a still image obtained with an image sensing element. After a color interleaved analog image signal is converted into digital data by an A/D converter, image data having color information (RGB data) of each pixel is prepared, compressed, and stored.

However, according to this method, a processing time of about 5 to 10 sec is required to store a still image with a resolution of 1,000,000 pixels or more. This apparatus cannot photograph images at a short interval.

Currently, for, e.g., a digital still camera apparatus, a method has been examined in which a color interleaved analog image signal with an analog value is stored at a high speed using an analog nonvolatile semiconductor memory as a medium for storing a still image.

Conventional storage media of this type store digital data. Card type semiconductor memory devices (e.g., smart media) detachable from a digital still camera apparatus are also used. A card type semiconductor memory device for storing an analog signal has also been examined.

However, when a card type semiconductor memory device is formed by simply containing a plurality of analog nonvolatile semiconductor memories in one card-like package, the number of connector signal lines necessary to externally output, from the card type semiconductor memory device, analog signals read out from the individual analog nonvolatile semiconductor memories increases. This impedes size and cost reduction of the card type semiconductor memory device.

In displaying a still image or in various image processing operations, RGB image data having luminance information of all of the RGB colors in units of pixels are generally used.

Conventionally, in, e.g., a digital still camera apparatus, a color interleaved analog image signal obtained using an image sensing element is converted to obtain color (RGB) image data. Even when an analog nonvolatile semiconductor memory is used, a color interleaved analog image signal read out from this memory must be converted into color image data.

To convert a color interleaved analog image signal into color image data, the luminance information of at least eight pixels positioned around a pixel to be processed is necessary. Hence, the luminance information of a total of nine pixels need be read out from corresponding analog nonvolatile semiconductor memories. Especially when the analog signal is to be directly converted into color image data at a high speed, the pixel array must be parallelly read out.

Unlike digital signals, analog signals can hardly share one signal line because their transient characteristics have delays due to the capacitance component of a signal line and errors are generated in the amplitudes as the clock frequency becomes high. Hence, the number of connector signal lines increases to impede size reduction of a card type semiconductor memory device.

SUMMARY OF THE INVENTION

The present invention has been made to solve the above problems, and has as its object to provide a card type semiconductor memory device capable of writing or reading a still image at a high speed using a small number of connector signal lines.

In order to achieve the above object, according to the present invention, there is provided a card type semiconductor memory device, wherein at least one memory chip for storing a still image and connection means having a number of signal lines for transferring various signals between the memory chip and a host device are mounted on a card-like substrate, the memory chip comprising a memory section comprising analog nonvolatile semiconductor memories for sequentially storing, as analog values, color interleaved analog image signals having analog luminance information of predetermined colors in units of pixels in synchronism with a predetermined clock signal, and a signal processing section for calculating, as analog values, the luminance information at a plurality of pixel positions, which are read out from the memory section, to convert the luminance information into color image data having analog luminance information of the respective colors in units of pixels, and outputting the color image data.

DESCRIPTION OF THE PREFERRED EMBODIMENT

The present invention will be described next with reference to the accompanying drawings.

FIG. 1 shows the arrangement of a card type semiconductor memory device according to an embodiment of the present invention.

Referring to FIG. 1, a plurality of memory chips 1 are mounted on a card-like substrate 2 and covered with a card cover 4.

Some addresses of address signals (not shown) input from an external device through a connector 3 connected at one end of the substrate 2 are decoded to select one of the memory chips 1. A color interleaved analog image signal obtained with an image sensing element is written in the selected memory chip.

A color interleaved analog image signal stored in one of the memory chips 1, which is selected in the same way as described above, is converted into color image data and read out.

Figure 1A:
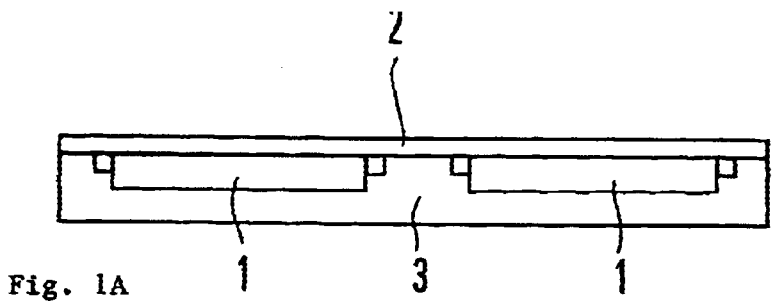
FIG. 1A is a top view of the invention.
Figure 1B:
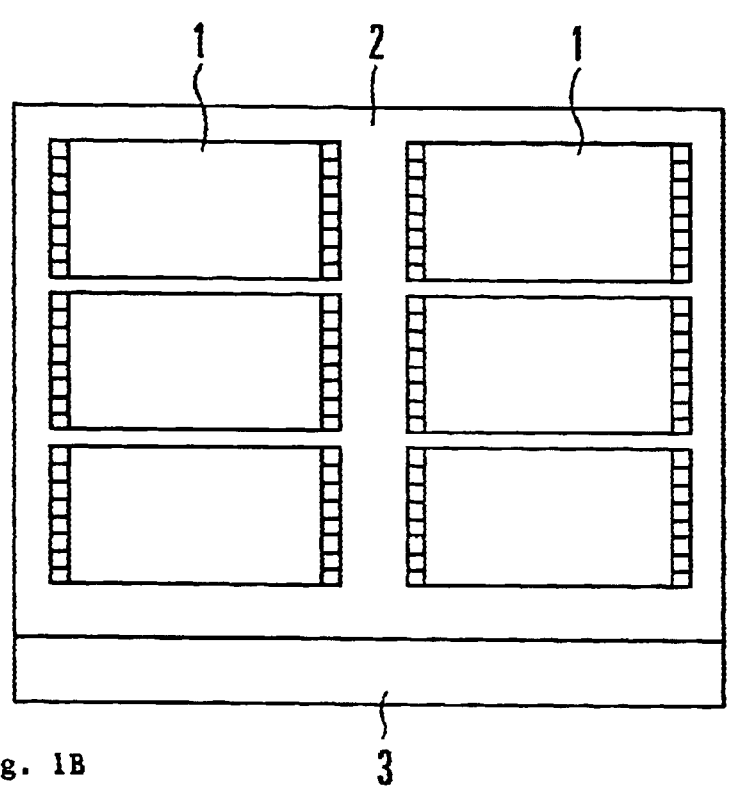
FIG. 1B is a front view of the invention.
Figure 1D:
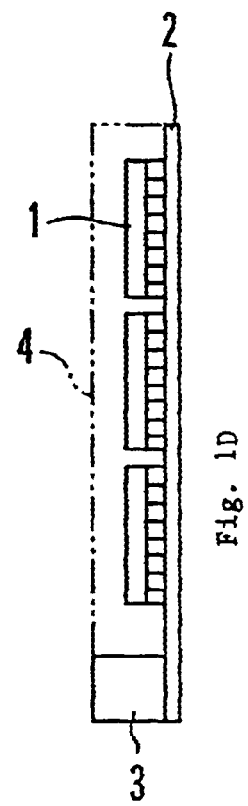
FIG. 1D is a side view of the invention.
Figure 1C:
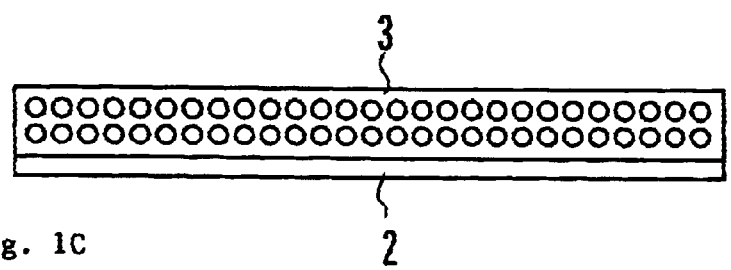
FIG. 1C is a bottom view of the invention.
Figure 2:
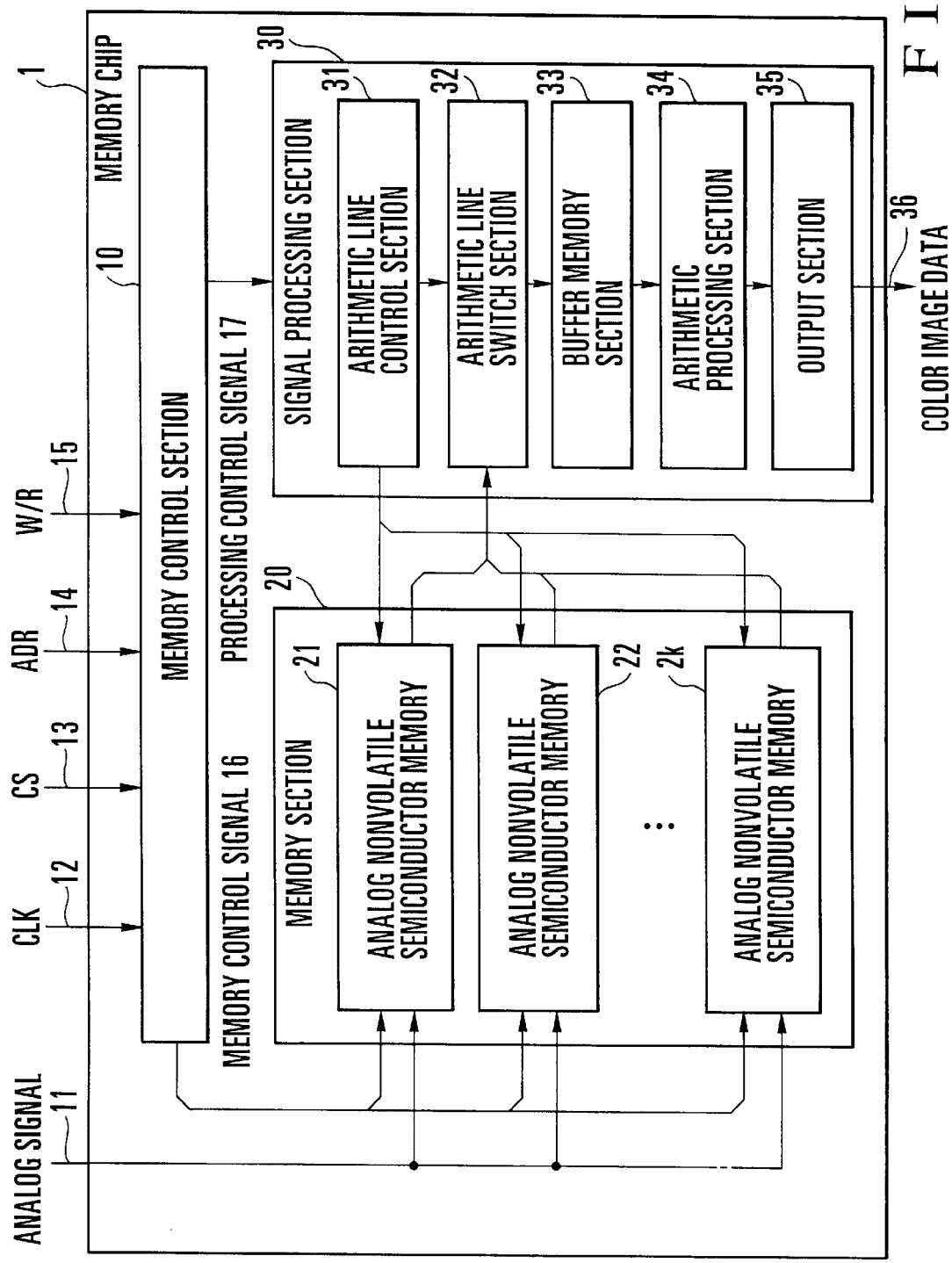
FIG. 2 is a block diagram showing a memory chip.

FIG. 2 shows a memory chip.

Referring to FIG. 2, a memory section 20 is a circuit section comprising analog nonvolatile semiconductor memories 21 to 2k for storing, as analog values, color interleaved analog image signals 11 obtained with an image sensing element. A signal processing section 30 is a circuit section for generating color image data from a plurality of analog values read out from the memory section 20.

The memory section 20 has a memory capacity for storing at least all color interleaved analog image signals 11 belonging to one still image.

A memory control section 10 is a circuit section for generating a memory control signal 16 for controlling the memory section 20 and a processing control signal 17 for controlling the signal processing section 30 on the basis of a CLK (clock) signal 12 and ADR (address) signal 14 input in synchronism with the color interleaved analog image signal 11.

As the operation of the present invention, the write operation will be described first with reference to FIG. 2.

Generally, the color interleaved analog image signal 11 obtained with an image sensing element (not shown) is an analog signal representing, as an amplitude value, the luminance value of each pixel, which is detected via a color (R, G, or B) filter.

In this case, the luminance values are discrete on the time axis. Each luminance value is output together with the CLK signal 12 representing the time position of the luminance value.

When a chip is selected by a CS signal 13, and a W/R (write/read control) signal 15 represents the write operation, the memory control section 10 of the chip generates the memory control signal 16 on the basis of an ADR (address) signal designated by a host device (e.g., a digital still camera apparatus) or the CLK signal 12, thereby selecting one of the analog nonvolatile semiconductor memories 21 to 2k in the memory section 20.

Each pixel value of the color interleaved analog image signal 11 is written in the selected one of the analog nonvolatile semiconductor memories 21 to 2k.

Hence, a still image can be written at a higher speed as compared to the prior art in which the color interleaved analog image signal 11 representing a still image is A/D-converted and further converted into color image data, and the digital data is written in a memory.

The read operation will be described next with reference to FIGS. 3A to 3C.

Figures 3A, 3B, 3C, 4:
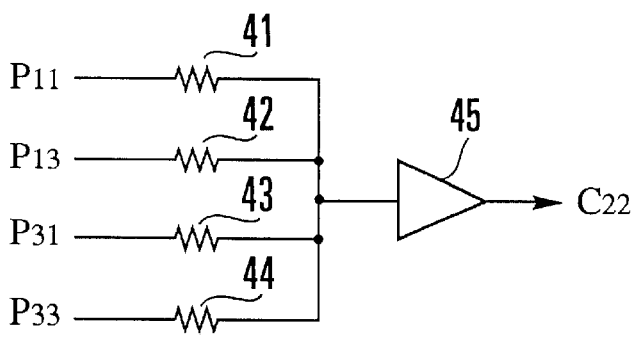
FIGS. 3A to 3C are explanatory views showing luminance interpolation processing.
FIG. 4 is the explanatory view showing an arrangement of an arithmetic processing section.

FIGS. 3A to 3C show an example of luminance interpolation for an image signal, in which FIG. 3A shows a pixel arrangement based on the Bayer matrix, FIG. 3B shows its main portion, and FIG. 3C shows linear interpolation expressions.

In the Bayer matrix, as shown in FIG. 3A, RGB color filters with the respective colors are arranged in a checkerboard pattern in units of pixels. Each pixel represents the luminance of one of the RGB colors.

In this example, the first horizontal line 1 represents luminance values of "R, G, R, G, . . ." from the left end. The next horizontal line 2 represents luminance values of "G, B, G, B, . . ." from the left end.

FIG. 3B shows the luminance values of pixels of the main portion (in the bold frame). For example, a pixel $P_{11}$ represents the luminance of the leftmost pixel of horizontal line 1, i.e., R (red) luminance value. A pixel $P_{22}$ represents the luminance of the second pixel from the left end of horizontal line 2, i.e., B (blue) luminance value.

To linearly interpolate the R luminance value at the position $P_{22}$ from R pixels in the vicinity, equation (1) shown in FIG. 3C is used.

More specifically, the average luminance value of four R pixels $P_{11}$, $P_{13}$, $P_{31}$, and $P_{33}$ around the pixel $P_{22}$ is obtained and used as an R (red) luminance value $C_{22}$ at the position $P_{22}$.

In a similar manner, a G (green) luminance value $A_{22}$ at the position $P_{22}$ is obtained using equation (2), and a B (blue) luminance value $B_{23}$ at a position $P_{23}$ is obtained using equation (3).

These equations can be generally used in correspondence with relative positions in the area indicated by the bold frame in FIG. 3B.

For example, when the bold frame is shifted to the right by two pixels up to the bold broken frame, the R (red) luminance value at a position $P_{24}$ can be obtained from equation (1).

Hence, when linear interpolation is to be performed on the basis of equations (1) to (3), the luminance values of a horizontal line containing the pixel to be interpolated and horizontal lines on the upper and lower sides of the horizontal line to be interpolated, i.e., a total of three horizontal lines are parallelly read out.

Actually, the luminance values $A_{22}$, $B_{22}$, and $C_{22}$ at the position $P_{22}$ are given by $$A_{22}=(P_{12}+P_{21}+P_{23}+P_{32})/4$$

$$B_{22}=P_{22}$$

$$C_{22}=(P_{11}+P_{13}+P_{31}+P_{33})/4$$

The minimum number of pixels that must be simultaneously read out to calculate the luminance values $A_{22}$, $B_{22}$, and $C_{22}$ is nine: $P_{11}$, $P_{12}$, $P_{13}$, $P_{21}$, $P_{22}$, $P_{23}$, $P_{31}$, $P_{32}$, and $P_{33}$.

The luminance values $A_{23}$, $B_{23}$, and $C_{23}$ at the position $P_{23}$ are given by $$A_{23}=P_{23}$$

$$B_{23}=(P_{22}+P_{24})/2$$

$$C_{23}=(P_{13}+P_{33})/2$$

The minimum number of pixels that must be simultaneously read out to calculate the luminance values $A_{23}$, $B_{23}$, and $C_{23}$ is five: $P_{13}$, $P_{22}$, $P_{23}$, $P_{24}$, and $P_{33}$.

Complex signal switching can be omitted when the luminance values of the 10 pixels are used to simultaneously calculate the luminance values of the two pixels ($P_{22}$ and $P_{23}$) The entire circuit arrangement can be simplified.

When a chip is selected by the CS signal 13, and the W/R (write/read control) signal 15 represents the read operation, the memory control section 10 of the chip generates the processing control signal 17 on the basis of an ADR (address) signal designated from a host device (e.g., a digital still camera apparatus) or the CLK signal 12.

Accordingly, an arithmetic line control section 31 of the signal processing section 30 selects one of the analog nonvolatile semiconductor memories 21 to 2k and parallelly reads out the luminance values of three horizontal lines necessary for the above-described luminance interpolation.

An arithmetic line switch section 32 switches and selects one luminance value to be processed from the luminance values read out from the arithmetic line control section 31 on the basis of a timing and outputs the luminance value to a buffer memory section 33.

An arithmetic processing section 34 performs luminance interpolation on the basis of the equations in FIG. 3C to generate data having pixel information of all colors (RGB) in units of pixels.

In this case, the equations shown in FIG. 3C can be realized by a product-sum operation circuit in which input values are added via resistive elements 41 to 44 and the sum result is output from a buffer element 45.

The resistance values of the resistive elements 41 to 44 can be changed in accordance with the weights of the input values. For linear interpolation, the resistive elements 41 to 44 can have the same resistance value.

The equations shown in FIG. 3C can be instantaneously processed at once by arranging a plurality of product-sum operation circuits.

Unlike the prior art in which digital arithmetic processing is performed using a DSP or the like, the time required for luminance interpolation, i.e., conversion from a color interleaved analog image signal into color image data can be greatly shortened with a very simple circuit arrangement.

Color image data 36 obtained from the color interleaved analog image signal 11 by the arithmetic processing section 34 are parallelly output, via an output section 35 of the memory chip 1, from individual signal lines as luminance information of the respective colors (RGB) per pixel.

When only a plurality of analog nonvolatile semiconductor memories are simply contained in one card-like package, eight connector signal lines for outputting analog signals are required for each analog nonvolatile semiconductor memory. According to the present invention, only three connector signal lines suffice for one memory chip (for RGB data). A still image can be written/read with a small number of connector signal lines at a high speed. As the number of analog nonvolatile semiconductor memories contained in one memory chip increases, the effect of reducing the number of connector signal lines becomes conspicuous.

The pixel information of all colors (RGB) obtained by the arithmetic processing section 34 can be parallelly output from individual signal lines. One output signal line may be shared by controlling the output timing of the respective pixel information by the arithmetic processing section 34 to time-divisionally output the pixel information.

In this case, since only one connector signal line suffices for one memory chip, the number of connector signal lines can be further decreased.

An A/D converter may be connected to the output section 35 of the memory chip 1 to convert the pixel information of all colors (RGB) obtained by the arithmetic processing section 34 into digital data. The output timing of the pixel information of the respective colors may be controlled to time-divisionally output the pixel information.

Unlike analog data, digital data can easily share signal lines. Hence, all memory chips can share output lines. As the number of memory chips mounted on one card type semiconductor memory device increases, the number of connector signal lines can be decreased.

Since the A/D converter is connected in units of memory chips 1, the output analog signal lines need not be bypassed in the substrate, unlike the arrangement in which the memory chips 1 share one A/D converter. For this reason, the influence of noise from digital signal system lines can be reduced.

In the above description, some addresses of address signals (not shown) from the host device are decoded, and the output is used as the CS signal 13 to select one of the memory chips 1. The method of selecting the memory chip 1 is not limited to this. For example, a predetermined memory chip 1 may be selected in accordance with the length (effective time length) of the CS signal 13.

Figure 5:
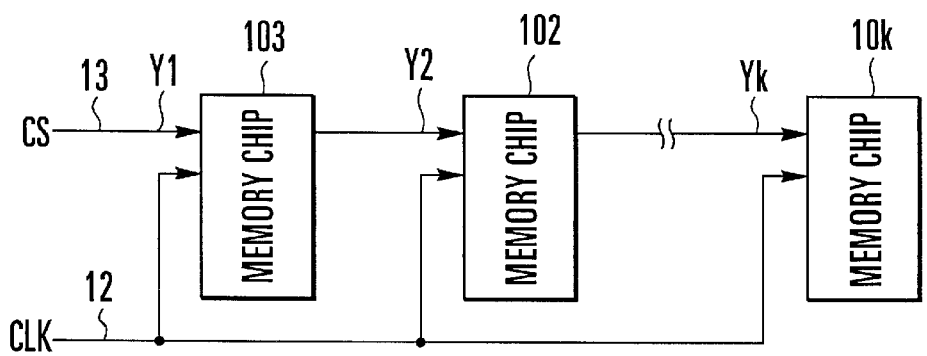
FIG. 5 is an explanatory view showing a memory chip selection method.
Figure 6:
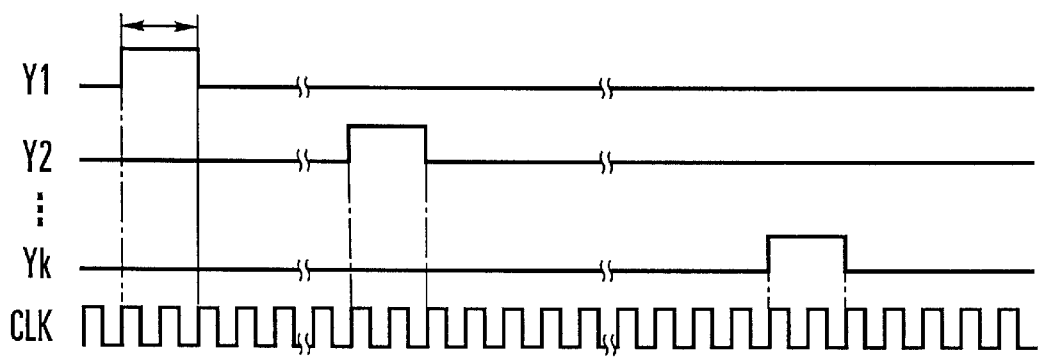
FIG. 6 is a timing chart showing the operation shown in FIG. 5.

FIG. 5 shows another memory chip selection method. FIG. 6 shows the operation shown in FIG. 5.

Memory chips 101 to 10k are cascade-connected by CS signals Y1 to Yk. As the CS signal Y1 of the memory chip 101, the CS signal 13 from the host device is input.

The CLK signal 12 is parallelly supplied to the memory chips 101 to 10k.

When a CS signal is input, the memory control section 10 of each of the memory chips 101 to 10k outputs the CS signal to the subsequent memory chip without any delay and simultaneously detects chip selection information according to the length of the CS signal on the basis of, e.g., the trailing edge of the CLK signal 12.

This chip selection information is compared with identification information set in each of the memory chips 101 to 10k in advance. When the two pieces of information match, the chip is selected. Otherwise, the chip is not selected.

For example, as shown in FIG. 6, when the length of the CS signal 13 corresponds to two trailing edges (two periods) of the CLK signal 12, a memory chip with identification information "2", i.e., the memory chip 102 is selected.

Using the CLK signal 12 input together with the color interleaved analog image signal 11, one memory chip is selected on the basis of the length of the CS signal 13. Hence, the connector signal line used as the chip selection address and the decoder therefor can be omitted, and the card type semiconductor memory device can be made compact.

The selection clock signal used to detect the length of the CS signal 13 is not limited to the CLK signal 12 of the color interleaved analog image signal 11. A selection clock signal may be separately supplied from a host device (e.g., an MPU) for outputting the CS signal.

Since a clock with a relatively low frequency can be used, the length of the CS signal 13 can be appropriately detected without strictly considering the delay in the circuit elements.

Figure 8:
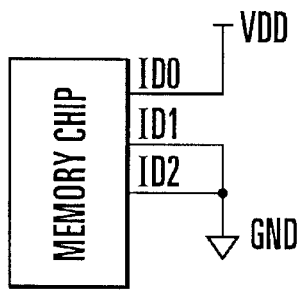
FIG. 8 is an explanatory view showing the identification information setting method.

To set identification information for each of the memory chips 101 to 10k, a fixed circuit pattern for applying different identification information to predetermined terminals ID0 to ID2 of the memory chip in accordance with the mounted position on the substrate 2 may be formed and incorporated in the memory chip, as shown in FIG. 8. The identification information input to the terminals ID0 to ID2 may be decoded in each chip as needed.

In the example shown in FIG. 8, when the terminals ID0 to ID2 represent a 3-bit identification signal with an upper bit at the terminal ID2, the memory chip 1 with number 1 is identified.

When some addresses of address signals (not shown) from the host device are decoded, and the output is used as the CS signal 13 to select one of the memory chips 1, the decoder may be incorporated in the memory chip. No peripheral circuits other than the memory chips need not be mounted on the substrate 2, so the card type semiconductor memory device can be made compact.

Figure 7:
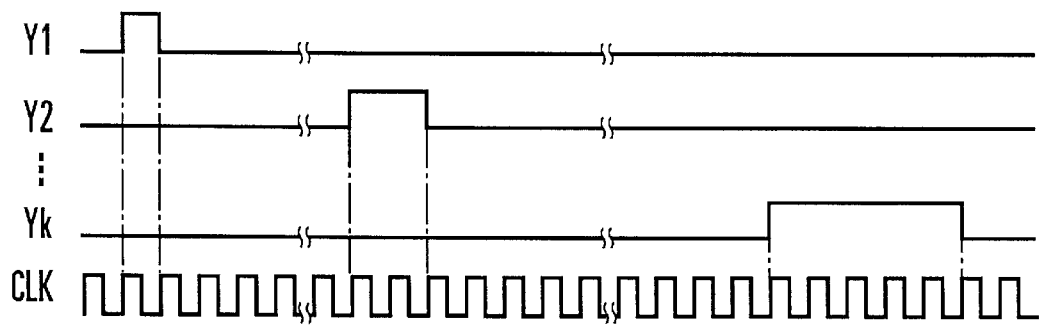
FIG. 7 is a timing chart showing an identification information setting method.

As another method of setting identification information, as shown in FIG. 7, in the registration mode immediately after power-on, resetting, or detection of a predetermined CS signal, the length of a CS signal input to each memory chip is detected and stored as the self identification information. In addition, a CS signal longer than the input CS signal by one clock is output to the subsequent memory chip.

With this operation, pieces of identification information are sequentially set in the memory chips in accordance with the order of connection of the CS signals, and the identification information setting terminals can be omitted.

As another method of selecting a predetermined memory chip 1 in accordance with the length of the CS signal 13, the CS signal 13 from the host device may be parallelly applied to the memory chips 1.

In this case as well, as described above, chip selection information according to the length of the CS signal is detected on the basis of the CLK signal 12. This chip selection information is compared with identification information set in each memory chip 1 in advance. When the two pieces of information match, the chip is selected. Otherwise, the chip is unselected.

As in the above-described chip selection method, using the CLK signal 12 input together with the color interleaved analog image signal 11, one memory chip is selected on the basis of the length of the CS signal 13. Hence, the connector signal line used as the chip selection address and the decoder therefor can be omitted, and the card type semiconductor memory device can be made compact.

As has been described above, according to the present invention, a color interleaved analog image signal input from a host device is directly stored in an analog nonvolatile semiconductor memory in a memory chip as an analog value in accordance with a clock signal synchronous with the color interleaved analog image signal. Pieces of luminance information at a plurality of pixel positions, which are read out from the memory, are calculated as analog values, converted into color image data having analog luminance information of the respective colors in units of pixels, and output.

When only a plurality of analog nonvolatile semiconductor memories are simply contained in one card-like package, nine connector signal lines for outputting analog signals are required at minimum for each analog nonvolatile semiconductor memory. However, in the present invention, three connector signal lines suffice (for RGB data) for each memory chip. A still image can be written/read with a small number of connector signal lines at a high speed. As the number of analog nonvolatile semiconductor memories contained in one memory chip increases, the effect of reducing the number of connector signal lines becomes conspicuous.

What is claimed is:

1. A card type semiconductor memory device, comprising:

at least one memory chip for storing a still image and connection means having a number of signal lines for transferring various signals between the memory chip and a host device are mounted on a card-like substrate, the memory chip comprising a memory section comprising analog nonvolatile semiconductor memories for sequentially storing, as analog values, color interleaved analog image signals having analog luminance information of predetermined colors in units of pixels in synchronism with a predetermined clock signal, and a signal processing section for calculating, as analog values, the luminance information at a plurality of pixel positions, which are read out from said memory section, to convert the luminance information into color image data having analog luminance information of the respective colors in units of pixels, and outputting the color image data.

2. A device according to claim 1, wherein said signal processing section time-divisionally outputs the analog luminance information of the respective colors to predetermined signal lines provided in units of said memory chips.

3. A device according to claim 1, wherein said signal processing section comprises A/D conversion means for converting the analog luminance information of each color to a predetermined signal line shared by said memory chips.

4. A device according to claim 1, wherein the memory chip is operative to detect chip selection information according to length of a chip selection signal from the host device on the basis of a predetermined selection clock signal, wherein said memory chip is operative to select itself when the chip selection information matches identification information uniquely set for said memory chip, and wherein said memory chip does not select itself when the chip selection information does not match the identification information.

5. A device according to claim 2, wherein the memory chip is operative to detect chip selection information according to length of a chip selection signal from the host device on the basis of a predetermined selection clock signal, wherein said memory chip is operative to select itself when the chip selection information matches identification information uniquely set for said memory chip, and wherein said memory chip does not select itself when the chip selection information does not match the identification information.

6. A device according to claim 2, wherein said signal processing section comprises A/D conversion means for converting the analog luminance information of each color to a predetermined signal line shared by said memory chips.

7. A device according to claim 6, wherein the memory chip is operative to detect chip selection information according to length of a chip selection signal from the host device on the basis of a predetermined selection clock signal, wherein said memory chip is operative to select itself when the chip selection information matches identification information uniquely set for said memory chip, and wherein said memory chip does not select itself when the chip selection information does not match the identification information.

8. A device according to claim 4, wherein said signal processing section comprises A/D conversion means for converting the analog luminance information of each color to a predetermined signal line shared by said memory chips.

* * * * *